United States Patent
Kato

(10) Patent No.: US 7,734,265 B2
(45) Date of Patent: Jun. 8, 2010

(54) AUDIO MUTING CIRCUIT AND AUDIO MUTING METHOD

(75) Inventor: Yasuhiro Kato, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 722 days.

(21) Appl. No.: 11/585,003

(22) Filed: Oct. 23, 2006

(65) Prior Publication Data
US 2007/0093222 A1     Apr. 26, 2007

(30) Foreign Application Priority Data
Oct. 21, 2005  (JP) .............................. 2005-307382

(51) Int. Cl.
*H04B 1/16* (2006.01)
(52) U.S. Cl. .................... 455/194.1; 455/212
(58) Field of Classification Search .............. 455/194.1, 455/201, 210, 212, 215, 218, 220–222
See application file for complete search history.

(56) References Cited
FOREIGN PATENT DOCUMENTS

| JP | 411163648 | * | 6/1999 |
| JP | 3073853 | | 9/2000 |
| JP | 2000-341047 | | 12/2000 |
| JP | 2003-289222 | | 10/2003 |

OTHER PUBLICATIONS

Partial English Translation of Japanese Registered Utility Model No. 3073853, Date of Registration: Sep. 27, 2000, Date of Publication: Dec. 15, 2000, 2 pages.
Patent Abstracts of Japan, Publication No. 2000-341047, Publication Date: Dec. 8, 2000, 1 page.
Patent Abstracts of Japan, Publication No. 2003-289222, Publication Date Oct. 10, 2003, 1 page.

* cited by examiner

*Primary Examiner*—Thanh C Le
(74) *Attorney, Agent, or Firm*—Osha • Liang LLP

(57) ABSTRACT

In an audio muting circuit, after a short delay from a first time at which a first mute signal generation circuit causes a first mute signal to fall from "H" level to "L" level, a second mute signal generation circuit causes a second mute signal to fall from "H" level to "L" level at a second time. A third mute signal generated by combining the first and second mute signals is caused to fall from "H" level to a predetermined level at the first time, and caused to fall from the predetermined level to "L" level at the second time. Thus, at the start of muting, the level of an audio signal is increased in stepwise manner. In this way, noise generated at the start of muting can be reduced.

4 Claims, 3 Drawing Sheets

AUDIO MUTING CIRCUIT AND AUDIO MUTING METHOD

BACKGROUND OF THE INVENTION

1. Field of the Invention

The present invention relates to an audio muting circuit and an audio muting method. In particular, the invention relates to an audio muting circuit and an audio muting method for muting an audio signal.

2. Description of the Background Art

An audio muting circuit provided in such audio-related equipment as a DVD (Digital Video Disc) player performs mute operation for silencing an audio output. A conventional audio muting circuit generates a short sharp "pop" noise (pop noise) at the start of muting.

FIG. 3 is a time chart showing waveforms of a mute signal of a conventional audio muting circuit and an audio signal appearing at an output terminal of the audio muting circuit. Referring to FIG. 3, in a silent state, the audio signal is at a potential of 0 V. At time t11, in response to fall of the mute signal from "H" level which is inactivation level to "L" level which is activation level, the potential of the audio signal becomes slightly higher than 0 V. Because of this, "pop" noise is generated at the start of muting.

Japanese Patent Laying-Open No. 2000-341047 for example discloses a technique that is applied to an audio power amplifier for which audio environment is important and that is used for preventing pop noise generated when power is supplied and when muting is cancelled, without dependence on a time constant capacitor element which is difficult to incorporate into a semiconductor integrated circuit. With this technique, an equivalent impedance Rx which can be varied in stepwise manner is used to control a transmission gain of an audio signal to accomplish stepwise and gradual cancellation of muting when power is supplied.

Further, Japanese Registered Utility Model No. 3073853 discloses an audio muting apparatus that uses a D/A converter to generate a signal with a gentle gradient that is necessary for muting, so that a low-pass filter can be dispensed with. With this apparatus, muting is accomplished by gradually changing a converted output voltage of the D/A converter from an initial voltage toward a predetermined voltage, and the muting is cancelled by gradually changing the converted output voltage from the predetermined voltage toward the initial voltage.

Furthermore, Japanese Patent Laying-Open No. 2003-289222 discloses an inverting amplifier with muting capability that exhibits superior muting performance while preventing an increase in power consumption, in spite of its simple circuit configuration.

As seen from the above, the conventional audio muting circuits have the problem that "pop" noise is generated at the start of muting.

SUMMARY OF THE INVENTION

A chief object of the present invention is therefore to provide an audio muting circuit and an audio muting method that can reduce noise generated at the start of muting.

An audio muting circuit according to an aspect of the present invention is an audio muting circuit muting an audio signal and includes: a first sub mute signal generation circuit outputting, in a normal mode, a first sub mute signal at an inactivation level and outputting, in a mute mode, the first sub mute signal at an activation level; a second sub mute signal generation circuit outputting, in the normal mode, a second sub mute signal at the inactivation level and outputting, in the mute mode, the second sub mute signal at the activation level; an NPN bipolar transistor connected between an audio line where the audio signal is transmitted and a line of a reference potential; and a PNP bipolar transistor connected between a line of a power supply potential and a control electrode of the NPN bipolar transistor, rendered nonconductive when a mute signal generated by combining the first and second sub mute signals is at the inactivation level, and rendered conductive when the mute signal is at the activation level. At start of muting, after a predetermined time from time when the first sub mute signal generation circuit changes the first sub mute signal from the inactivation level to the activation level, the second sub mute signal generation circuit changes the second sub mute signal from the inactivation level to the activation level.

An audio muting circuit according to another aspect of the present invention is an audio muting circuit muting an audio signal, and includes: a mute signal generation circuit outputting, in a normal mode, a mute signal at an inactivation level and outputting, in a mute mode, the mute signal at an activation level; and a first transistor connected between an audio line where the audio signal is transmitted and a line of a reference potential, rendered nonconductive when the mute signal is at the inactivation level and rendered conductive when the mute signal is at the activation level. At start of muting, for a predetermined period in which the mute signal is changed from the inactivation level to the activation level, the mute signal generation circuit sets the mute signal to a predetermined level between the inactivation level and the activation level.

Preferably, the audio muting circuit further includes a second transistor connected between a line of a power supply potential and a control electrode of the first transistor, rendered nonconductive when the mute signal is at the inactivation level and rendered conductive when the mute signal is at the activation level. The first transistor is rendered conductive in response to application of the power supply potential to the control electrode.

Still preferably, the mute signal generation circuit includes: a first sub mute signal generation circuit outputting, in the normal mode, a first sub mute signal at the inactivation level and outputting, in the mute mode, the first sub mute signal at the activation level; and a second sub mute signal generation circuit outputting, in the normal mode, a second sub mute signal at the inactivation level and outputting, in the mute mode, the second sub mute signal at the activation level. The second transistor is rendered conductive or nonconductive in response to the mute signal generated by combining the first and second sub mute signals. At start of muting, after a predetermined time from time when the first sub mute signal generation circuit changes the first sub mute signal from the inactivation level to the activation level, the second sub mute signal generation circuit changes the second sub mute signal from the inactivation level to the activation level.

An audio muting method according to the present invention is an audio muting method for muting an audio signal. A transistor is provided that is connected between an audio line where the audio signal is transmitted and a line of a reference potential, is rendered nonconductive when a mute signal is at an inactivation level and is rendered conductive when the mute signal is at an activation level. At start of muting, for a predetermined period in which the mute signal is changed from the inactivation level to the activation level, the mute signal is set to a predetermined level between the inactivation level and the activation level.

In accordance with the present invention, for a predetermined period in which the mute signal is changed from the inactivation level to the activation level, the mute signal is set to a predetermined level between the inactivation level and the activation level. Accordingly, the audio signal has its level increased in stepwise manner. In this way, noise generated at the start of muting can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
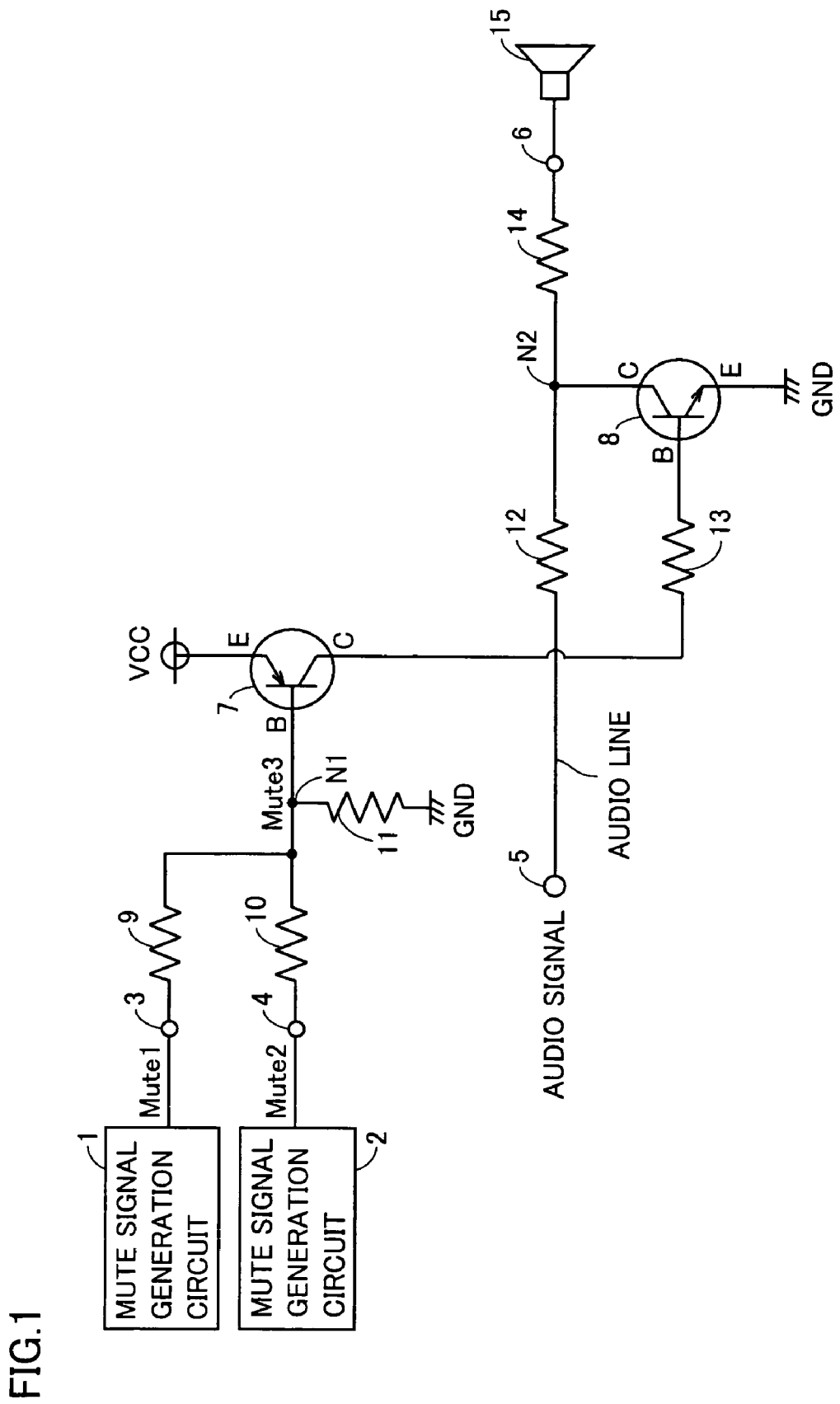
FIG. 1 is a circuit block diagram showing a schematic configuration of an audio muting circuit according to an embodiment of the present invention.

FIG. 1 is a circuit block diagram showing a schematic configuration of an audio muting circuit according to an embodiment of the present invention. Referring to FIG. 1, the audio muting circuit includes mute signal generation circuits 1, 2, mute terminals 3, 4, an input terminal 5, an output terminal 6, a PNP bipolar transistor 7, an NPN bipolar transistor 8, and resistor elements 9 to 14. Output terminal 6 is connected to a speaker 15.

An audio signal is supplied to input terminal 5, transmitted through an audio line and provided from output terminal 6 to speaker 15. Speaker 15 reproduces the audio signal provided from output terminal 6. Resistor element 12 and resistor element 14 are connected in series between input terminal 5 and output terminal 6. NPN bipolar transistor 8 is connected between a node N2 located between resistor element 12 and resistor element 14 and a line of a ground potential GND.

PNP bipolar transistor 7 and resistor element 13 are connected in series between a line of a power supply potential VCC (3.3 V for example) and base B of NPN bipolar transistor 8. Mute signal generation circuit 1 provides a mute signal Mute 1 at "H" level which is inactivation level or at "L" level which is activation level to mute terminal 3. Mute signal generation circuit 2 provides a mute signal Mute 2 at "H" level which is inactivation level or at "L" level which is activation level to mute terminal 4. Mute signal generation circuits 1, 2 are push-pull type circuits and incorporated for example in a microcomputer. Resistor element 9 is connected between mute terminal 3 and a node N1, resistor element 10 is connected between mute terminal 4 and node N1, and node N1 is connected to base B of PNP bipolar transistor 7. Mute signal Mute 1 supplied to mute terminal 3 and mute signal Mute 2 supplied to mute terminal 4 are combined into a mute signal Mute 3 that is supplied to base B of PNP bipolar transistor 7. Resistor element 11 is connected between node N1 and the line of ground potential GND.

In a normal mode, mute signal generation circuit 1 supplies to mute terminal 3 mute signal Mute 1 at "H" inactivation level, and mute signal generation circuit 2 supplies to mute terminal 4 mute signal Mute 2 at "H" inactivation level. At this time, mute signal Mute 3 which is generated by combining mute signals Mute 1 and Mute 2 is at "H" inactivation level. Thus, PNP bipolar transistor 7 and NPN bipolar transistor 8 are nonconductive so that the audio signal supplied to input terminal 5 is transmitted through the audio line and output from output terminal 6.

In a mute mode, after a short time from the time when mute signal generation circuit 1 supplies the mute signal at "L" activation level to mute terminal 3, mute signal generation circuit 2 supplies the mute signal at "L" activation level to mute terminal 4. At this time, mute signal Mute 3 generated by combining mute signals Mute 1 and Mute 2 is at "L" activation level. Thus, PNP bipolar transistor 7 is rendered conductive so that electric current flows from the line of power supply potential VCC via PNP bipolar transistor 7 and resistor element 13 to base B of NPN bipolar transistor 8. Accordingly, NPN bipolar transistor 8 is rendered conductive to cause the audio line to be fixed at ground potential GND.

Figure 2:
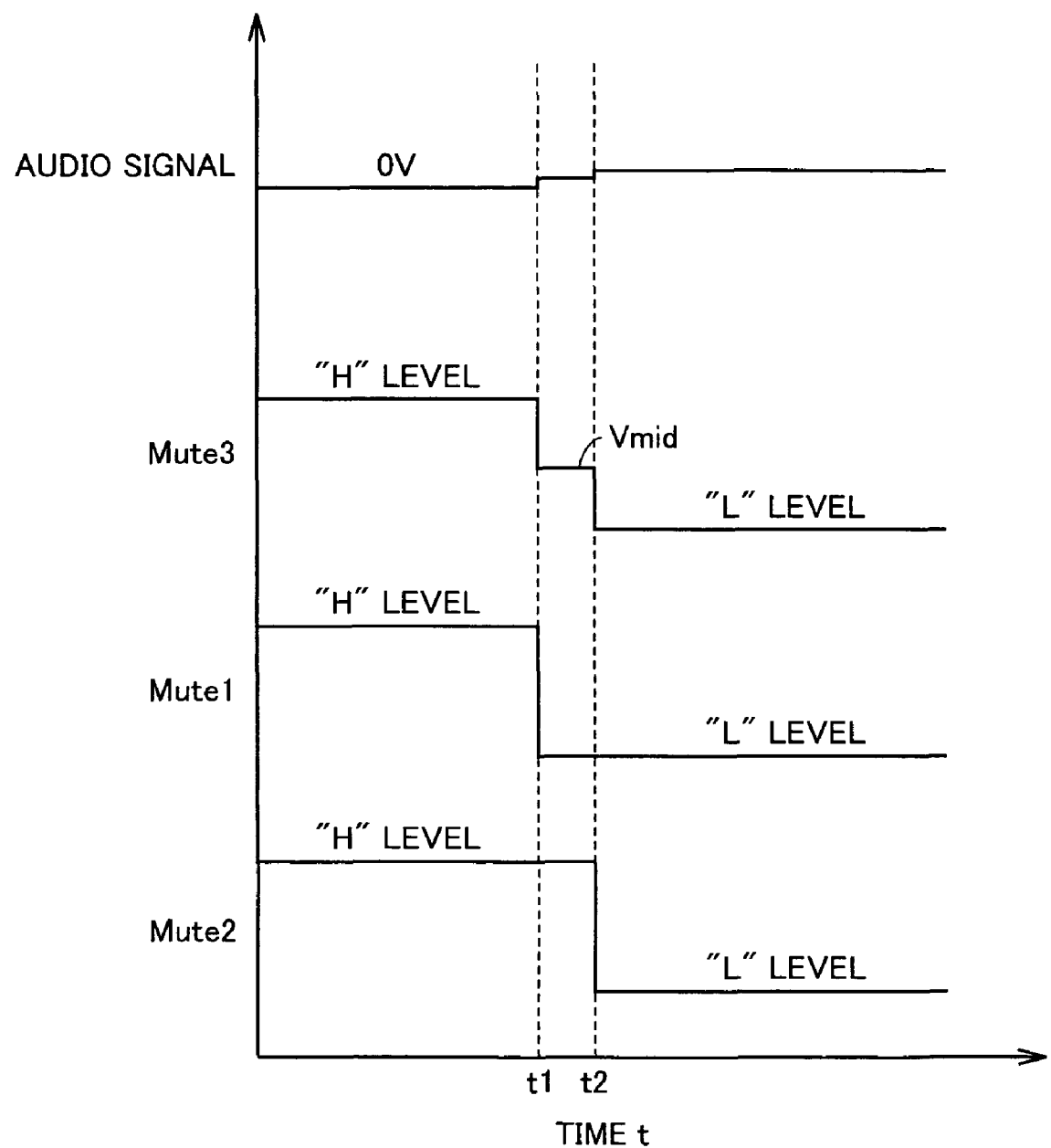
FIG. 2 is a time chart showing waveforms of mute signals and an audio signal of the audio muting circuit as shown in FIG. 1.

FIG. 2 is a time chart showing waveforms of mute signals and an audio signal appearing at output terminal 6 of the audio muting circuit shown in FIG. 1. Referring to FIG. 2, at time t1, mute signal generation circuit 1 causes mute signal Mute 1 to fall from "H" inactivation level to "L" activation level. Subsequently, at time t2 with a slight delay from time t1, mute signal generation circuit 2 causes mute signal Mute 2 to fall from "H" inactivation level to "L" activation level.

In this case, mute signal Mute 3 generated by combining mute signals Mute 1 and Mute 2 is caused to fall from "H" inactivation level to a predetermined level Vmid at time t1 and then from predetermine level Vmid to "L" activation level at time t2. Here, mute signals Mute 1 and Mute 2 have the same voltage amplitude, and resistor elements 9 to 11 have resistor values that allow predetermined level Vmid to be at a level between "H" level and "L" level.

Thus, PNP bipolar transistor 7 and NPN bipolar transistor 8 are rendered conductive in stepwise manner. While PNP bipolar transistor 7 is conductive, power supply potential VCC is applied via PNP bipolar transistor 7 and resistor element 13 to base B of NPN bipolar transistor 8. Accordingly, the audio line is raised to a potential slightly higher than ground potential GND.

Figure 3:
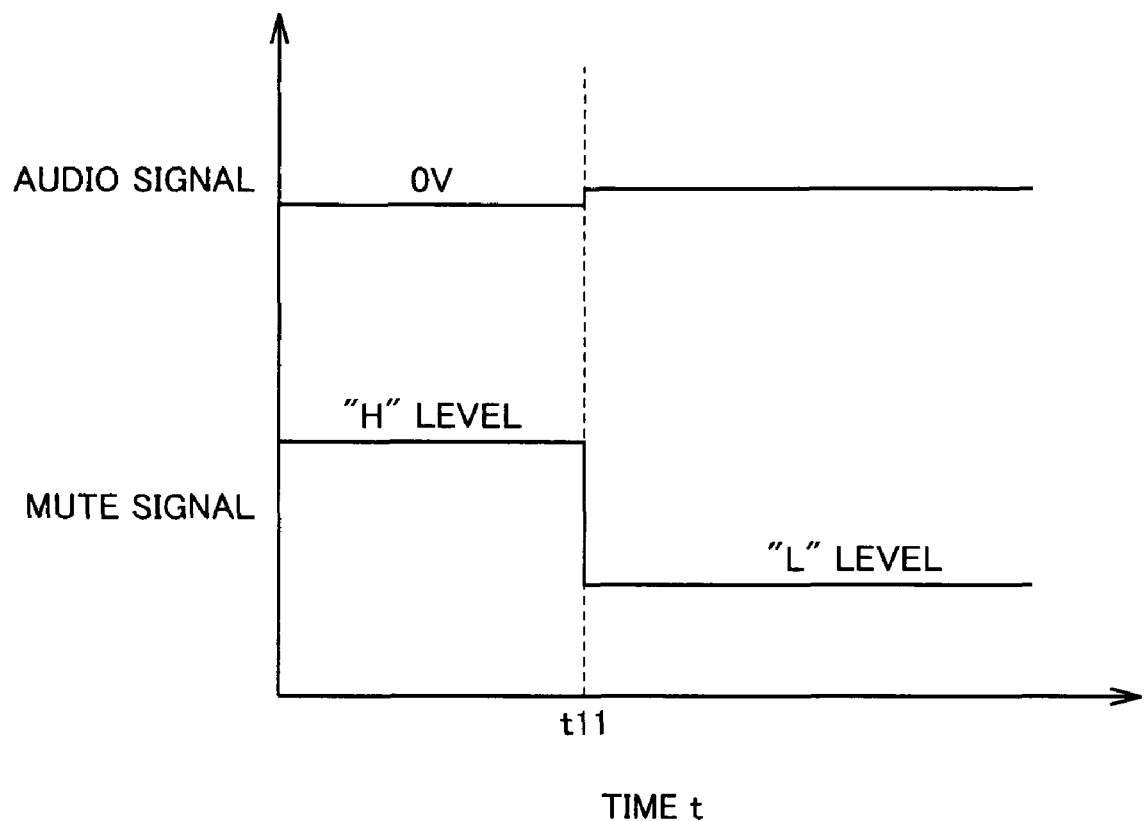
FIG. 3 is a time chart showing waveforms of a mute signal and an audio signal of a conventional audio muting circuit.

Regarding the conventional audio muting circuit, as shown in FIG. 3, the level of the audio signal is increased at a time to a level slightly higher than 0 V at time t11, resulting in the problem that pop noise is generated at the start of muting.

In contrast, in the present embodiment, as shown in FIG. 2, for a predetermined period in which mute signal Mute 3 is changed from "H" inactivation level to "L" activation level, namely for the period from time t1 to time t2, mute signal Mute 3 is set to predetermined level Vmid. Therefore, at the start of muting, the level of the audio signal is increased in stepwise manner at time t1 and time t2. In this way, noise generated at the start of muting can be reduced.

Although the example as illustrated herein changes the level of mute signal Mute 3 in two steps at the start of muting, the manner of changing the level is not limited to the illustrated one and the level may be changed in three or four steps.

Further, the audio muting circuit is applicable not only to the DVD player but also to various types of audio-related equipment such as DVD recorder and CD player.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An audio muting circuit muting an audio signal, comprising:
   a first sub mute signal generation circuit outputting, in a normal mode, a first sub mute signal at an inactivation level and outputting, in a mute mode, the first sub mute signal at an activation level;
   a second sub mute signal generation circuit outputting, in the normal mode, a second sub mute signal at the inactivation level and outputting, in the mute mode, the second sub mute signal at the activation level;
   an NPN bipolar transistor connected between an audio line where said audio signal is transmitted and a line of a reference potential; and
   a PNP bipolar transistor connected between a line of a power supply potential and a control electrode of said NPN bipolar transistor, rendered nonconductive when a mute signal generated by combining said first and second sub mute signals is at the inactivation level, and rendered conductive when said mute signal is at the activation level,
   wherein at start of muting, after a predetermined time from time when said first sub mute signal generation circuit changes said first sub mute signal from the inactivation level to the activation level, said second sub mute signal generation circuit changes said second sub mute signal from the inactivation level to the activation level.

2. An audio muting circuit muting an audio signal, comprising:
   a mute signal generation circuit outputting, in a normal mode, a mute signal at an inactivation level and outputting, in a mute mode, the mute signal at an activation level; and
   a first transistor connected between an audio line where said audio signal is transmitted and a line of a reference potential, rendered nonconductive when said mute signal is at the inactivation level and rendered conductive when said mute signal is at the activation level,
   wherein at start of muting, for a predetermined period in which said mute signal is changed from the inactivation level to the activation level, said mute signal generation circuit sets said mute signal to a predetermined level between the inactivation level and the activation level.

3. The audio muting circuit according to claim 2, further comprising a second transistor connected between a line of a power supply potential and a control electrode of said first transistor, rendered nonconductive when said mute signal is at the inactivation level and rendered conductive when said mute signal is at the activation level,
   wherein said first transistor is rendered conductive in response to application of said power supply potential to said control electrode.

4. The audio muting circuit according to claim 3, wherein said mute signal generation circuit includes:
   a first sub mute signal generation circuit outputting, in the normal mode, a first sub mute signal at the inactivation level and outputting, in the mute mode, the first sub mute signal at the activation level; and
   a second sub mute signal generation circuit outputting, in the normal mode, a second sub mute signal at the inactivation level and outputting, in the mute mode, the second sub mute signal at the activation level,
   said second transistor is rendered conductive or nonconductive in response to said mute signal generated by combining said first and second sub mute signals, and at start of muting, after a predetermined time from time when said first sub mute signal generation circuit changes said first sub mute signal from the inactivation level to the activation level, said second sub mute signal generation circuit changes said second sub mute signal from the inactivation level to the activation level.

* * * * *